(12) United States Patent
Mulkens et al.

(10) Patent No.: US 7,038,760 B2
(45) Date of Patent: May 2, 2006

(54) LITHOGRAPHIC APPARATUS AND DEVICE MANUFACTURING METHOD

(75) Inventors: Johannes Catharinus Hubertus Mulkens, Waalre (NL); Antonius Theodorus Anna Maria Derksen, Eindhoven (NL); Joeri Lof, Eindhoven (NL); Klaus Simon, Eindhoven (NL); Alexander Straaijer, Eindhoven (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/873,648

(22) Filed: Jun. 23, 2004

(65) Prior Publication Data

US 2005/0018156 A1    Jan. 27, 2005

(30) Foreign Application Priority Data

Jun. 30, 2003    (EP) .................................. 03254139

(51) Int. Cl.
*G03B 27/52* (2006.01)
*G03B 27/42* (2006.01)

(52) U.S. Cl. .......................................... 355/30; 355/53
(58) Field of Classification Search ................. 355/30, 355/53, 72, 75
See application file for complete search history.

(56) References Cited

U.S. PATENT DOCUMENTS

| | | | | |
|---|---|---|---|---|
| 3,573,975 | A | 4/1971 | Dhaka et al. ................ 117/212 |
| 3,648,587 | A | 3/1972 | Stevens .......................... 95/44 |
| 4,346,164 | A | 8/1982 | Tabarelli et al. ............ 430/311 |
| 4,390,273 | A | 6/1983 | Loebach et al. ............ 355/125 |
| 4,396,705 | A | 8/1983 | Akeyama et al. ........... 430/326 |
| 4,480,910 | A | 11/1984 | Takanashi et al. ............ 355/30 |
| 4,509,852 | A | 4/1985 | Tabarelli et al. .............. 355/30 |
| 4,796,469 | A * | 1/1989 | Brown et al. ................ 73/49.2 |
| 5,040,020 | A | 8/1991 | Rauschenbach et al. ...... 355/53 |
| 5,121,256 | A | 6/1992 | Corle et al. ................. 359/664 |
| 5,610,683 | A * | 3/1997 | Takahashi ..................... 355/53 |
| 5,715,039 | A | 2/1998 | Fukuda et al. ................ 355/53 |
| 5,825,043 | A | 10/1998 | Suwa .......................... 250/548 |
| 5,900,354 | A | 5/1999 | Batchelder .................. 430/395 |
| 6,191,429 | B1 | 2/2001 | Suwa .......................... 250/548 |
| 6,236,634 | B1 | 5/2001 | Lee et al. .................... 369/112 |
| 6,560,032 | B1 | 5/2003 | Hatano ........................ 359/656 |
| 6,600,547 | B1 | 7/2003 | Watson et al. |
| 6,603,130 | B1 | 8/2003 | Bisschops et al. ........ 250/492.1 |
| 6,633,365 | B1 | 10/2003 | Suenaga ....................... 355/53 |
| 6,788,477 | B1 * | 9/2004 | Lin .............................. 359/820 |
| 6,809,794 | B1 * | 10/2004 | Sewell ......................... 355/30 |
| 6,867,844 | B1 * | 3/2005 | Vogel et al. .................. 355/30 |
| 2002/0020821 | A1 | 2/2002 | Van Santen et al. ........ 250/492 |

(Continued)

FOREIGN PATENT DOCUMENTS

DE          206 607          2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Henry Hung Nguyen
(74) *Attorney, Agent, or Firm*—Pillsbury Winthrop Shaw Pittman LLP

(57) ABSTRACT

The pressure and/or height of liquid in a liquid reservoir of an immersion lithography apparatus is obtained by a measurement device. The pressure and/or height can be used to determine the height and/or tilt of the substrate.

21 Claims, 3 Drawing Sheets

U.S. PATENT DOCUMENTS

| | | | |
|---|---|---|---|
| 2002/0163629 A1 | 11/2002 | Switkes et al. | 355/53 |
| 2003/0123040 A1 | 7/2003 | Almogy | 355/53 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar., 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $K_3$ coefficient in nonparaxial NNA scaling equations for resolution, depth of focus, and immersion lithography, *J. Microlith., Microfab., Microsyst.* 1(1):7-12 (2002).

European Search Report for EP 03254139.3 dated Jun. 2, 2004.

* cited by examiner

LITHOGRAPHIC APPARATUS AND DEVICE MANUFACTURING METHOD

This application claims priority from European patent application EP 03254139.3, filed Jun. 30, 2003, which is incorporated herein in its entirety.

FIELD

The present invention relates to a lithographic projection apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Another liquid supply system which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

A possible problem with such immersion lithography apparatus is that it is difficult to adequately control the relative positions (including displacement and/or orientation) of the projection system and substrate table and hence the thickness of the liquid film between the projection system and the substrate. There are at least three reasons for this. Firstly, the substrate table and the projection system are hydrodynamically coupled so that the mechanical control of the substrate table position may be difficult and an accurate set point would be essential. Secondly, the level (height) sensors used in conventional lithography apparatus typically are not compatible with a liquid reservoir. Such sensors are generally based around a light beam that is reflected by the substrate at a relatively low angle of incidence and it is difficult to provide the necessary beam directing elements within the space occupied by the immersion liquid. Thirdly, in immersion lithography, imaging quality may be more sensitive to variations in the Z position of the substrate.

Accordingly, it would be advantageous, for example, to provide a leveling device that can be used in an immersion lithography apparatus.

According to an aspect, there is provided a lithographic projection apparatus comprising:

an illumination system arranged to condition a radiation beam;

a support structure configured to hold a patterning device, the patterning device being capable of imparting the radiation beam with a pattern;

a substrate table configured to hold a substrate;

a projection system arranged to project the patterned radiation beam onto a target portion of the substrate;

a liquid supply system configured to at least partly fill a space between the projection system and an object on the substrate table, with a liquid; and a measurement device configured to obtain a pressure, height, or both of liquid in the space.

If liquid is confined in a space between a projection system and a substrate, change in the orientation and/or vertical position of the substrate may change the pressure of the liquid. Thus, measurement and/or determination of the pressure and/or height of the liquid may provide a simple result from which the orientation and/or vertical position of the substrate relative to the projection system, or at least changes in it, can be obtained. The exact relationship between pressure and/or height of the liquid and vertical height and/or orientation of the substrate will depend on the shape, size and nature of the liquid supply system and can be calculated or empirically derived for each application. For example, if the liquid supply system rigidly confines the liquid then changes in the orientation and/or vertical position of the substrate lead to greater pressure changes than if the liquid is more elastically confined.

In an embodiment, the pressure and/or height is obtained at two or more points spaced apart in the plane of the substrate. This enables an indication of the tilt of the substrate about one or more axes to be determined.

A form of measurement device that may be used comprises a tube in liquid communication with liquid in the space, the tube having an open end and extending at least in part vertically, and a sensor configured to measure the height of the liquid in the tube. The sensor may be an optical or capacitive sensor or employ a series of electrodes successively wetted as the liquid level rises in the tube.

According to a further aspect, there is provided a device manufacturing method comprising:

providing a liquid to at least partly fill a space between an object on a substrate table of a lithographic apparatus and a projection system of the lithographic apparatus;

obtaining the pressure, height or both of liquid in the space; and projecting a patterned beam of radiation, using the projection system, through the liquid onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
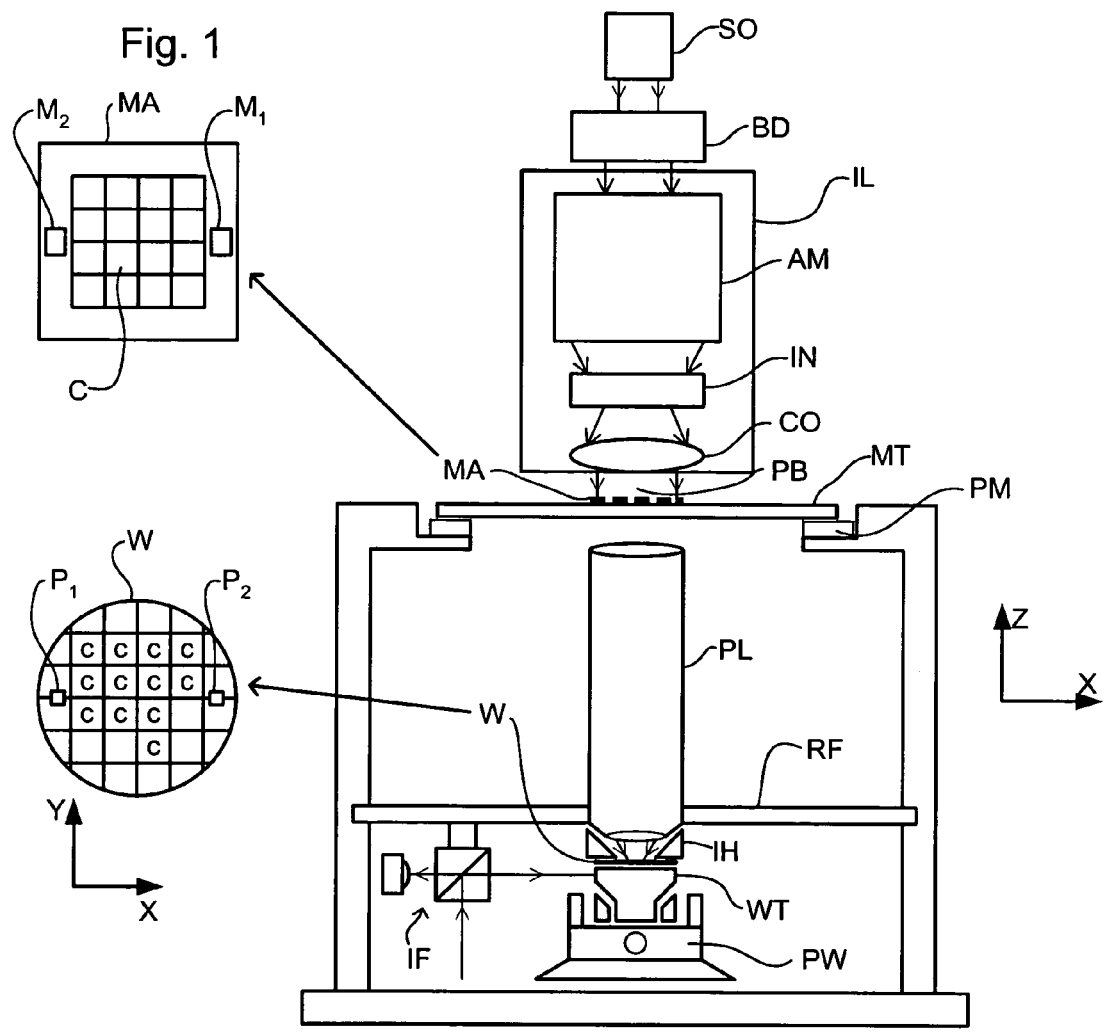
FIG. 1 depicts a lithographic projection apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting patterning device (e.g. a mask) MA and connected to first positioning device PM for accurately positioning the patterning device with respect to item PL;

a substrate table (e.g. a wafer table) WT for holding a substrate (e.g. a resist-coated wafer) W and connected to second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2. A liquid supply system IH supplies liquid to a space between the final element of the projection system PL and the substrate W.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 5:
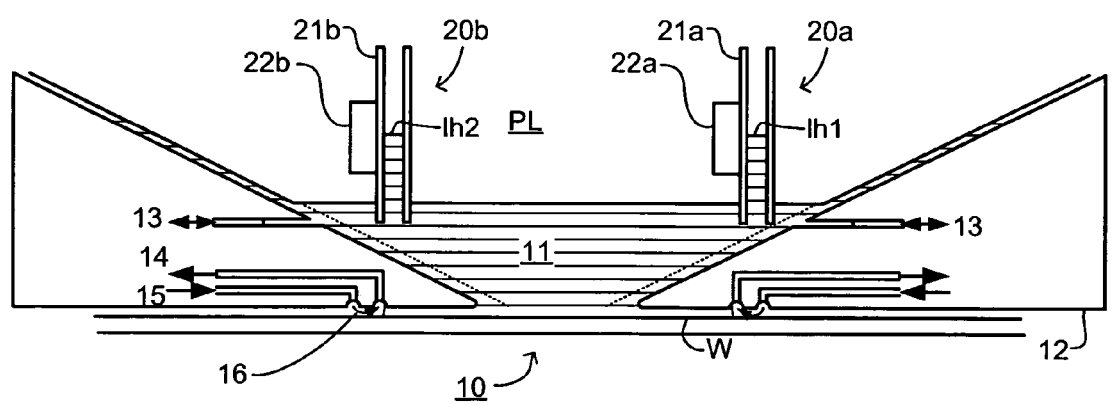
FIG. 5 depicts a liquid reservoir of an embodiment of the invention.

FIG. 5 shows a liquid reservoir 10 between the projection system PL and the substrate W which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of focus.

In an embodiment, the reservoir 10 comprises a contactless seal to the substrate W around the image field of the projection system PL so that the liquid is confined to fill the space between the substrate's primary surface, which faces the projection system PL, and the final optical element of the projection system PL. The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system and the substrate with a liquid. This liquid is brought into the space below the projection system and within the seal member 12. In an embodiment, the seal member 12 extends a little above the bottom element of the projection system and the liquid rises above the final element so that a buffer of liquid is provided. The seal member 12 has an inner periphery that at the upper end closely conforms to the shape of the projection system or the final element thereof and may, e.g. be round. At the bottom the inner periphery closely conforms to the shape of the image field, e.g. rectangular, though this is not necessarily so. The seal member is substantially stationary in the XY plane relative to the projection system though there may be some relative movement in the Z direction (in the direction of the optical axis). A seal is formed between the seal member and the surface of the substrate. In an embodiment, this seal is a contactless seal and may be a gas seal.

Figure 2:
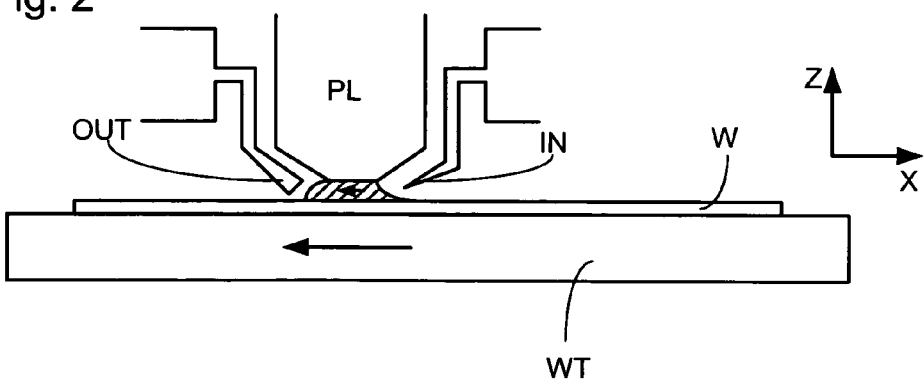
FIG. 2 is a side view of a liquid supply system.

The liquid 11 is confined in the reservoir 10 by a seal device 16. As illustrated in FIG. 2, the seal device is a contactless seal i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level or under pressure on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Three measurement devices 20a, 20b (only two of which are shown in FIG. 5) are provided to measure the pressure and/or height of the liquid 11 at three locations spaced apart in the XY plane. In this embodiment, the measurement devices comprise narrow tubes 21a, 21b in liquid communication with the liquid 11 and each have at least a part that extends generally upward. The heights lh1, lh2 of the fluid in the tubes, which are effectively manometers, are measured by sensors 22a, 22b to determine the pressure of the liquid at the point where the tube enters the reservoir 10. In an embodiment, the tubes 21a, 21b are narrow so that not too great a volume of liquid enters them but not so narrow that capillary forces affect the measurements. Sensors 22a, 22b may be capacitive sensors, e.g. with two elongate plates on the outside of the tube such that the amount of liquid between the plates affects the capacitance of the two plates. A series of annular or part annular electrodes on the inner or outer walls of the tubes allows the liquid level to be measured in discrete steps, either resistively or capacitively. Optical sensors may also be used with transparent tubes in which case a float or layer of colored liquid immiscible with the immersion liquid may be employed to ease detection of the liquid level. A magnetic float and reed switches and/or Hall effect sensors might also be employed. Other types of pressure sensor may also be used.

The pressure and/or height results are linked to the height and/or tilt of the substrate table in a way dependent on the geometry of the reservoir 10 and the manner in which the liquid is confined. If the liquid is more rigidly confined, e.g. by closing the gap between seal member 12 and projection system PL or by providing a wave suppressor in that gap, there will be a greater pressure or height change with a change in height of the substrate table. An appropriate equation, or look up table, to derive height and/or tilt values can be derived theoretically from knowledge of the relevant characteristics of the reservoir or determined empirically. Because the seal member 12 is generally stationary relative to the projection system, tilt is not derived directly from the pressure and/or height results but changes in tilt can be derived from the first and second time derivatives of pressure or height at two or three points so that tilt values can be determined using an initial measurement and integrating appropriate derivatives of pressure or height. The measured substrate height and/or tilt values are supplied to the stage motion control system and used therein in the conventional manner.

In a variant of this embodiment, the seal member 12 is stationary relative to the substrate table rather than the projection system, in which case the liquid height and/or pressure at two or three spaced apart locations gives a direct measurement of substrate table tilt, but no measurement of height.

Figure 3:
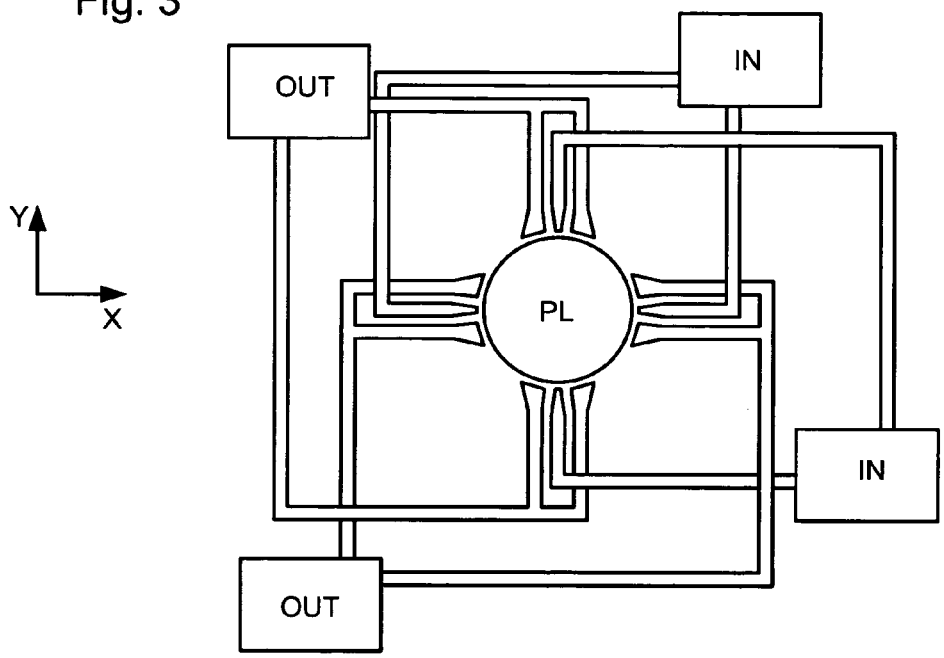
FIG. 3 is a plan view of the liquid supply system of FIG. 2.
Figure 4:
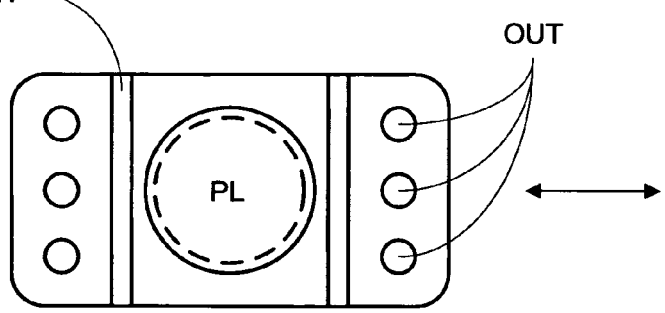
FIG. 4 depicts another liquid supply system.
Figure 4:
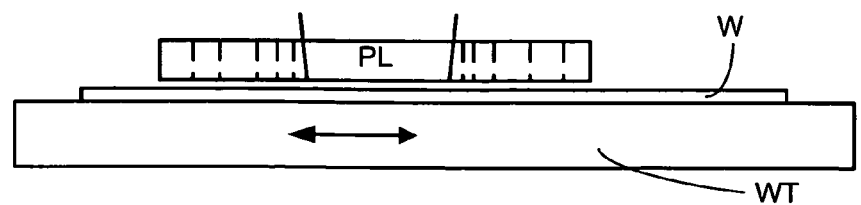

While specific embodiments of the invention have been described above, it will be appreciated that the invention may be practiced otherwise than as described. For example, while three sensors can be used to derive values for height and for tilt about two horizontal axes, two or one sensor may be used if only one tilt value or only height is needed. Often in a scanning apparatus, only a height and a tilt value about an axis parallel to the scanning direction is needed. More sensors may be used for error averaging. Further, the measurement device(s) may be applied to the liquid supply systems of FIGS. 2, 3 and/or 4 to derive height and/or tilt values of the substrate in such an apparatus. The present invention can be applied to any immersion lithography apparatus, in particular, but not exclusively, lithography apparatus with the types of liquid supply system mentioned above. The description is not intended to limit the invention.

The invention claimed is:

1. A lithographic projection apparatus comprising:
   an illumination system arranged to condition a radiation beam;
   a support structure configured to hold a patterning device, the patterning device being capable of imparting the radiation beam with a pattern;
   a substrate table configured to hold a substrate;
   a projection system arranged to project the patterned radiation beam onto a target portion of the substrate;
   a liquid supply system configured to at least partly fill a space between the projection system and an object on the substrate table, with a liquid; and
   a measurement device configured to obtain a pressure, height, or both of liquid in the space as a measure of height and/or tilt of the substrate table, the substrate, or both.

2. Apparatus according to claim 1, further comprising a second measurement device configured to obtain the pressure, height, or both of the liquid at a point displaced in the plane of the substrate from the measurement device.

3. Apparatus according to claim 2, further comprises a third measurement device configured to obtain the pressure, height, or both of the liquid at a point displaced in the plane of the substrate from the measurement device and the second measurement device.

4. Apparatus according to claim 1, wherein the measurement device comprises a tube in liquid communication with liquid in the space, the tube having an open end and extending at least in part vertically, and a sensor configured to measure a height of the liquid in the tube.

5. Apparatus according to claim 1, wherein the sensor comprises an optical sensor, a capacitive sensor or a series of electrodes successively wetted as the liquid level rises in the tube.

6. Apparatus according to claim 1, wherein the liquid supply system comprises:
a member extending along at least a part of the boundary of the space between the projection system and the substrate table; and
a gas seal device configured to form a gas seal between the member and a surface of the substrate.

7. Apparatus according to claim 1, further comprising:
a positioning device configured to position the substrate table; and
a controller configured to control the positioning device on the basis of height values, tilt values or both derived from results from the measurement device.

8. Apparatus according to claim 7, wherein the controller is configured to determine tilt values from first and second time derivatives of the pressure, height, or both measured at two or more spatial points with one or more measurement devices.

9. A device manufacturing method comprising:
providing a liquid to at least partly fill a space between a substrate on a substrate table of a lithographic apparatus and a projection system of the lithographic apparatus;
obtaining the pressure, height or both of liquid in the space as a measure of height and/or tilt of the substrate table, the substrate, or both; and
projecting a patterned beam of radiation, using the projection system, through the liquid onto a target portion of the substrate.

10. Method according to claim 9, comprising obtaining the pressure, height or both of the liquid at two points displaced from each other in the plane of the substrate with one or more measurement devices.

11. Method according to claim 9, comprising obtaining the pressure, height or both of the liquid at three points displaced from each other in the plane of the substrate.

12. Method according to claim 9, wherein obtaining the pressure, height or both comprises measuring a height of liquid in a tube, the tube in liquid communication with liquid in the space, having an open end and extending at least in part vertically.

13. Method according to claim 9, comprising forming a gas seal between a member and a surface of the substrate, the member extending along at least a part of the boundary of the space between the projection system and the substrate table.

14. Method according to claim 9, further comprising:
positioning the substrate table; and
controlling the positioning on the basis of height values, tilt values or both derived from results of the obtaining the pressure, height or both of liquid in the space.

15. Method according to claim 14, comprising determining tilt values from first and second time derivatives of the pressure, height, or both measured at two or more spatial points with one or more measurement devices.

16. A lithographic projection apparatus comprising:
an illumination system arranged to condition a radiation beam;
a support structure configured to hold a patterning device, the patterning device being capable of imparting the radiation beam with a pattern;
a substrate table configured to hold a substrate;
a projection system arranged to project the patterned radiation beam onto a target portion of the substrate;
a liquid supply system configured to at least partly fill a space between the projection system and a localized area of an object on the substrate table, with a liquid, said liquid supply system extending along at least part of a boundary of said localized area;
a measurement device configured to obtain a pressure, height, or both of liquid in the space;
a positioning device configured to position the substrate table; and
a controller configured to control the positioning device on the basis of height values, tilt values or both derived from results from the measurement device.

17. Apparatus according to claim 16, further comprising a second measurement device configured to obtain the pressure, height, or both of the liquid at a point displaced in the plane of the object from the measurement device.

18. Apparatus according to claim 16, wherein the measurement device comprises a tube in liquid communication with liquid in the space, the tube having an open end and extending at least in part vertically, and a sensor configured to measure a height of the liquid in the tube.

19. Apparatus according to claim 16, wherein the controller is configured to determine tilt values from first and second time derivatives of the pressure, height, or both measured at two or more spatial points with one or more measurement devices.

20. Apparatus according to claim 16, wherein the object is a substrate.

21. Apparatus according to claim 1, wherein the object is a substrate.

* * * * *